United States Patent
Chowdhury et al.

(10) Patent No.: US 6,980,011 B1
(45) Date of Patent: Dec. 27, 2005

(54) METHOD AND APPARATUS FOR DETECTING ELECTRICAL FAILURES ON A DIE THROUGH MAXIMIZING PASSIVE VOLTAGE CONTRAST ON ITS SURFACE

(75) Inventors: Vijay Chowdhury, Fremont, CA (US); James Hahn, Livermore, CA (US)

(73) Assignee: Altera Corporation, San Jose, CA (US)

( * ) Notice: Subject to any disclaimer, the term of this patent is extended or adjusted under 35 U.S.C. 154(b) by 0 days.

(21) Appl. No.: 10/757,694

(22) Filed: Jan. 13, 2004

(51) Int. Cl.[7] .................... G01R 31/305; G01R 31/302
(52) U.S. Cl. ....................... 324/751; 324/750; 324/765
(58) Field of Search ......... 324/750–751; 250/310–311

(56) References Cited

U.S. PATENT DOCUMENTS

| | | | | |
|---|---|---|---|---|
| 3,631,238 A | * | 12/1971 | MacDonald | 250/307 |
| 3,971,936 A | * | 7/1976 | Hoppe | 250/311 |
| 5,414,261 A | * | 5/1995 | Ellisman et al. | 250/311 |
| 6,091,249 A | * | 7/2000 | Talbot et al. | 324/751 |
| 6,252,412 B1 | * | 6/2001 | Talbot et al. | 324/750 |
| 6,344,750 B1 | * | 2/2002 | Lo et al. | 324/751 |
| 6,566,885 B1 | * | 5/2003 | Pinto et al. | 324/501 |
| 6,583,634 B1 | * | 6/2003 | Nozoe et al. | 324/751 |
| 6,642,726 B2 | * | 11/2003 | Weiner et al. | 324/751 |
| 6,734,429 B2 | * | 5/2004 | Takagi | 250/310 |
| 6,774,648 B1 | * | 8/2004 | Lin et al. | 324/752 |
| 6,812,050 B1 | * | 11/2004 | Ramappa | 438/17 |

* cited by examiner

*Primary Examiner*—Paresh Patel
(74) *Attorney, Agent, or Firm*—Morgan, Lewis & Bockius LLP

(57) ABSTRACT

A method and apparatus for maximizing passive voltage contrast on the surface of a die and then using the maximized passive voltage contrast to identify electrical failures in the die. The method employs a primary electron beam to scan the surface of the die. In response, secondary electrons are emitted from the die and then captured by a secondary electron detector. The density of secondary electrons is further modulated by a passive voltage near the die surface. To enhance the passive voltage contrast on the die surface, the incident angle of the primary electron beam is adjusted with respect to the die, the passive voltage contrast reaching a maximum at an incident angle of about 75° or above. With such enhanced contrast, an image depicting the magnitude of the secondary electron current can be used to detect electrical failures in the die.

18 Claims, 6 Drawing Sheets

(A)

(B)

(A)

(B)

(A)

(B)

(A)

(B)

METHOD AND APPARATUS FOR DETECTING ELECTRICAL FAILURES ON A DIE THROUGH MAXIMIZING PASSIVE VOLTAGE CONTRAST ON ITS SURFACE

FIELD OF THE INVENTION

The present invention relates generally to the field of integrated circuit manufacture and, in particular, to a method and apparatus for detecting electrical failures on a die through maximizing passive voltage contrast on its surface.

BACKGROUND OF THE INVENTION

Semiconductor technology has improved dramatically in the last few decades. As a benchmark, the minimum feature size, i.e., the dimension of the smallest feature actually fabricated on a silicon wafer, has been reduced from several microns to about 90 nm and it is expected to continuously shrink with the development of nanotechnology. As a result, a highly integrated semiconductor die can host tens of millions of transistors. The side effect of such achievement is that a small manufacturing defect occurring to any individual transistor, e.g., an opening at its electrical contact, may escalate to a serious circuit-level quality issue.

As one of the most versatile instruments available for the examination and analysis of the micro-structural characteristics of solid objects, the scanning electron microscope (SEM) has been used extensively in the semiconductor industry to detect various types of manufacturing defects. The primary reason for choosing the SEM is its high resolution, which makes it possible to identify those defects that are visible only by examining the significantly magnified surface of a die. Currently, the typical resolution of a commercial SEM is 1.5 nm.

The basic principle of SEM is illustrated in conjunction with FIG. 1 in which a primary electron beam 100 bombards the surface 110 of a specimen 120. The trajectory of one beam electron 102 inside and outside the specimen 120 is highlighted for illustrative purposes. When a particle like the beam electron 102 impinges upon the surface 110 of the specimen 120, the interactions between the beam electron 102 and the particles that constitute the specimen can be divided into two categories: (1) elastic scattering, (2) and inelastic scattering, see FIGS. 1(B) and (C), respectively.

When elastic scattering occurs, the magnitude of the beam electron 130's velocity remains virtually constant. As a result, the kinetic energy, $$E = \frac{1}{2}m_e v^2,$$

where $m_e$ is the electron's mass and v is its velocity, is unchanged. In general, there is less than 1 eV of energy transferred from the beam electron 130 to a specimen particle 135. Such energy loss is negligible compared to the kinetic energy of the beam electron 130, which is typically at the level of several KeV or higher. However, the direction of the beam electron 130 is often different from its original direction by an angle $\phi_{elastic}$, ranging from 0° up to 180°. This is because elastic scattering results from collisions of electrons with atomic nuclei, whose mass is significantly larger than that of the electrons.

In contrast, when inelastic scattering occurs, a significant amount of the kinetic energy is transferred from a beam electron 140 to the specimen particles 145. As a result, the kinetic energy of the beam electron 140 decreases after the collision. However, the direction change caused by inelastic scattering (represented by the angle $\phi_{elastic}$) is usually far smaller than the direction change caused by elastic scattering.

Referring again to FIG. 1(A), when beam electron 102 enters specimen 120, it randomly collides with the specimen particles along its trajectory. There is a possibility that the beam electron 102 may be backscattered out of specimen 120 or be captured by a specimen particle and stay in specimen 120. Among the series of collisions, each inelastic scattering transfers a certain amount of a beam electron's kinetic energy to the particles, which sometimes leads to the ejection of loosely bound electrons from the particles. These ejected electrons are commonly referred to as secondary electrons, and the majority of them receive an initial kinetic energy of 0–50 eV. The secondary electrons along the trajectory of beam electron 102 can be grouped into two classes: (1) those secondary electrons 104 and 105 that are generated within a certain distance D to the specimen surface 110, and (2) those secondary electrons 106 that are generated inside the specimen beyond the distance D. The secondary electrons 104 and 105 in the first class may escape from the specimen surface 110 while the secondary electrons in the second class are very likely to be captured by other particles in the specimen.

Within the first class of secondary electrons, secondary electrons 104 are generated by the primary beam electron 102 while secondary electrons 105 are generated by the backscattered electron 108. The number of escaping secondary electrons 104 per unit area generated by the primary beam electron 102 is much greater than the number of secondary electrons 105 generated by the backscattered electron 108. Further, when the electron beam 100 scans across the specimen 120, the beam-produced secondary electrons 104 respond to local surface features of specimen 120 and therefore carry information about the specimen surface, while the secondary electrons 105 generated by the backscattered electrons do not include such information and they act more or less as background noise. Therefore, a secondary electron detector (not shown) is incorporated in a SEM to measure the magnitude of secondary electron current above the surface of the specimen 120 and the SEM generates an image of the specimen surface according to the current magnitude.

When a SEM scans a specimen using a primary electron beam, the primary beam electrons may stay in the specimen or be backscattered out of the specimen and the secondary electrons generated by the primary beam electrons may escape from the surface of the specimen or exit as part of a ground current if the specimen is grounded. If the number of electrons that enter the specimen and the number that leave the specimen are different, the specimen will be electrically charged and therefore have a nonzero voltage. If the net result is an increase of electrons in the specimen, the specimen will have a negative electrical potential which, in turn, repels primary beam electrons accessing the specimen surface. The specimen then appears darker in a SEM image due to a decrease of secondary electron current. In contrast, if the net result is a decrease of electrons in the specimen, the specimen will have a positive electrical potential that attracts more primary beam electrons hitting the specimen surface with higher electrical kinetic energy, producing a higher secondary electron current. Therefore, the specimen appears brighter in a SEM image.

When a die comprising different electrical components is exposed to a primary electron beam, different portions of the die may have different potentials depending upon their surface compositions. This phenomenon is also referred to as passive voltage contrast (PVC), since no external power supplies are involved. Accordingly, different portions of the die may have different brightness on the SEM image. Such brightness differences can be employed to detect certain defects such as electrical openings on the die. The brightness difference is directly related to the secondary electron current difference and therefore the electrical potential difference between the different portions on the die which, in turn, depends upon the dimension of those electrical components on the die. For example, the capacity of an electrically isolated conductor for accumulating electrons on its surface is a function of its surface dimension. However, the need to produce devices with ever smaller minimum feature size results in electrical components with ever smaller surface dimension. Thus, the brightness difference caused by PVC between different components is often too little to recognize on a conventional SEM image.

Therefore, it would be desirable to develop a method of identifying electrical failures in an integrated circuit on a die by maximizing the brightness difference between different components on a SEM image.

SUMMARY

The present invention is directed to a method for detecting electrical failures on a die by maximizing passive voltage contrast on its surface. The method first attaches a die to the supporting surface of an electrically grounded sample holder and then scans the die surface using a primary electron beam. The supporting surface is adjusted such that the primary electron beam impinges upon the die surface at a particular angle and produces a maximized passive voltage contrast that maximizes the difference of secondary electron currents at different locations on the die surface. The secondary electron current difference is then expressed as a maximized brightness difference on an image, which can be used to detect electrical failures in the die.

In one embodiment of the present invention, the sample holder is positioned in a SEM's scanning chamber. The sample holder comprises a base and a stand having an oblique support surface on the base. A die is attached to the oblique surface. The die is electrically connected to the ground through the sample holder. The base can be adjusted to slowly increase the incident angle of a primary electron beam. The passive voltage contrast on the die reaches a maximum when the incident angle is approximately 75° or above.

BRIEF DESCRIPTION OF THE DRAWINGS

The aforementioned features and advantages of the invention as well as additional features and advantages thereof will be more clearly understood hereinafter as a result of a detailed description of preferred embodiments of the invention when taken in conjunction with the drawings wherein.

Like reference numerals refer to corresponding parts throughout the several views of the drawings.

DESCRIPTION OF EMBODIMENTS

As discussed above, a very small minimum feature size reduces PVC's impact on the secondary electron currents. Even though there is still a difference in terms of current magnitude due to PVC, such a difference may be too tiny to cause brightness variation in a SEM image. A possible solution to the problem is to significantly increase the magnitude of secondary electron currents near the die surface. For example, if the current magnitude increases by a factor of 10, the magnitude of current difference caused by PVC will also increase by a factor of 10, which may result in cognizable brightness difference in the image.

Figure 1:
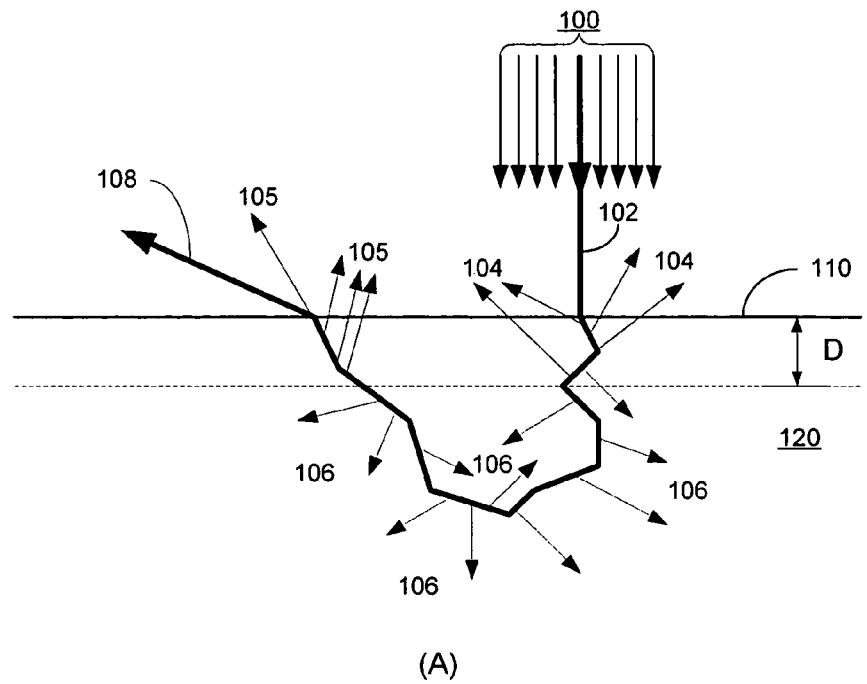
FIGS. 1(A)–1(C) depict two categories of collisions between a primary beam electron and specimen particles, i.e., elastic scattering and inelastic scattering.
Figure 1:
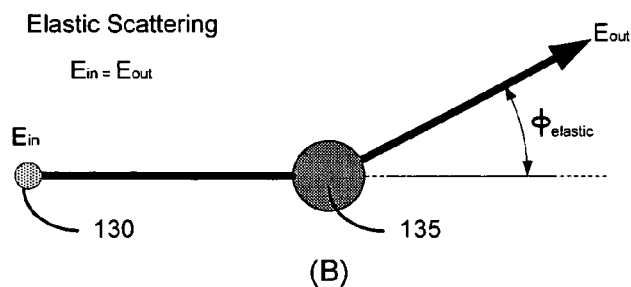
Figure 1:
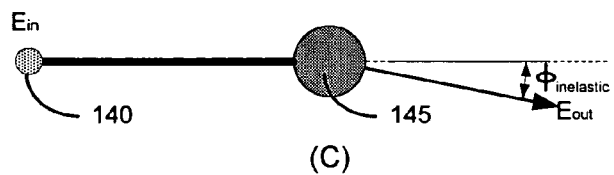
Figure 2:
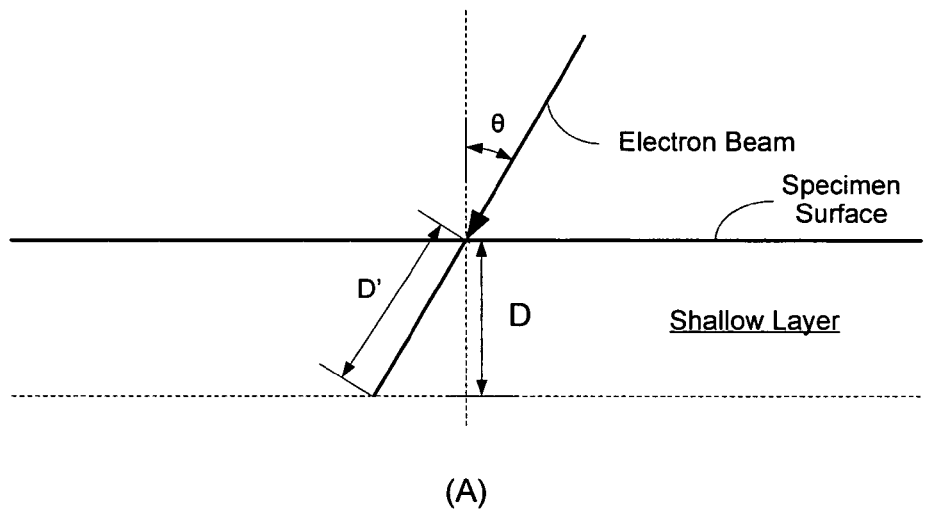
FIGS. 2(A) and 2(B) schematically illustrate the relationship between the secondary electron current and the incident angle of the primary electron beam.
Figure 2:
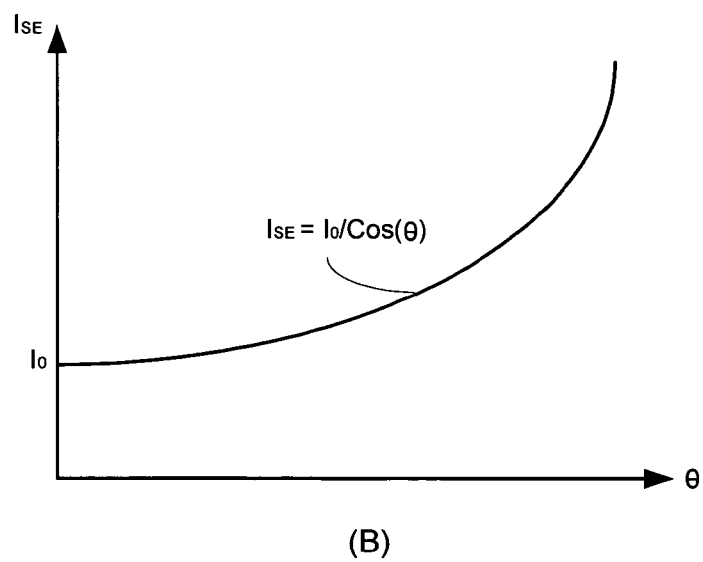

It is known through experiments that the magnitude of secondary electron current increases as the incident angle of the electron beam, $\theta$, increases (see FIG. 2(A)). This is because that the number of secondary electrons generated by a primary beam electron depends upon the length of the electron's trajectory within the shallow layer of the specimen. A larger incident angle means a longer trajectory for the primary beam electron in the shallow layer (compare, e.g., the two lengths D' and D) and therefore more secondary electrons are generated along the trajectory. The relationship between the secondary electron current and the incident angle can be approximated as $$I_{SE} = \frac{I_0}{\cos\theta}$$

(see FIG. 2(B)). In other words, increasing the incident angle of a primary electron beam can magnify the secondary electron current near a specimen's surface, which is helpful in improving a SEM's resolution.

When a SEM charges a specimen surface with a primary electron beam of low accelerating energy, e.g., 1–5 KeV, any conductor that is isolated from the ground or floating will be charged to a level of static negative equilibrium after a certain time. The negative electrical field surrounding the conductor repels the beam electrons before they reach the conductor to generate more secondary electrons. As a result, the conductor appears darker than a similar conductor that is electrically grounded. Meanwhile, since the conductor itself is an equipotential volume, adjusting the incident angle of the primary electron beam has no effect upon the secondary electron current. Therefore, the brightness of an isolated conductor should remain constant in the image. In contrast, a conductor that has a path to ground will not be charged to equilibrium and therefore appears brighter when the incident angle of the primary electron beam increases.

Figure 3:
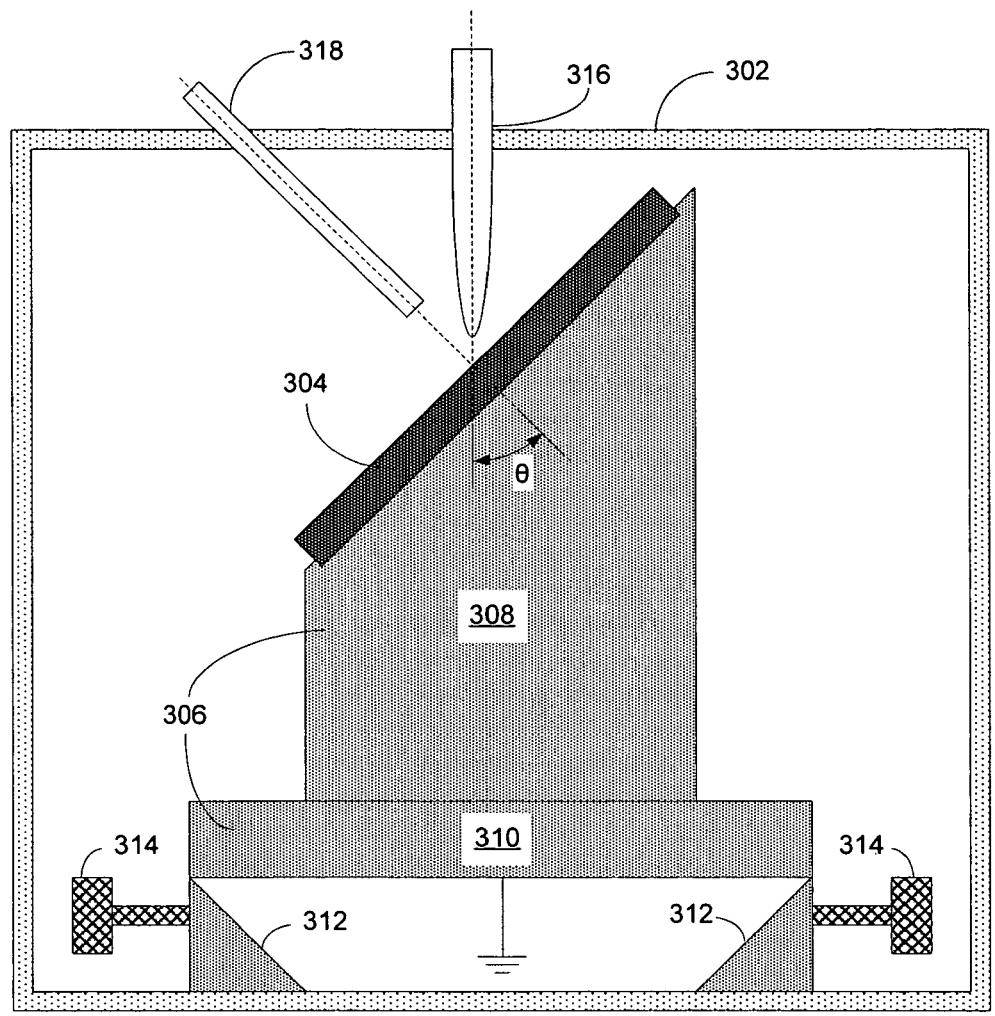
FIG. 3 depicts an apparatus in accordance with the invention that is used for measuring secondary electron current when the incident angle of the primary electron beam is adjusted to reach a maximum passive voltage contrast.

FIG. 3 illustrates an apparatus in accordance with the invention that is used for measuring secondary electron current when the incident angle of the primary electron beam is adjusted to reach a maximum passive voltage contrast. The apparatus includes a container 302 that contains a die sample 304 attached to a sample holder 306. The sample holder 306 further comprises a stand 308 and a base 310. The stand 308 has an oblique support surface to which the die sample 304 is attached. The base 310 can be adjusted through the two pairs of control device 314 and triangle-shaped support 312 to change the tilting angle θ and height of the support surface. The die sample 304 is electrically connected to the ground through the sample holder 306. From the top of the container 302, a primary beam electron gun 316 is inserted into the container. The electron gun 316 releases a primary electron beam towards the surface of the die sample 304 at an incident angle of θ. A secondary electron collector 318 is placed near the die surface to measure a secondary electron current caused by the primary electron beam. The measured data are then fed into a computer processing system (not shown) to generate an image of the die surface, which can be shown on a monitor screen or printed out on a paper for further analysis. In one embodiment, the incident angle θ is initially set to be 45°. A series of SEM images are created starting from 45° and at an increment of 5° per measurement.

Figure 4:
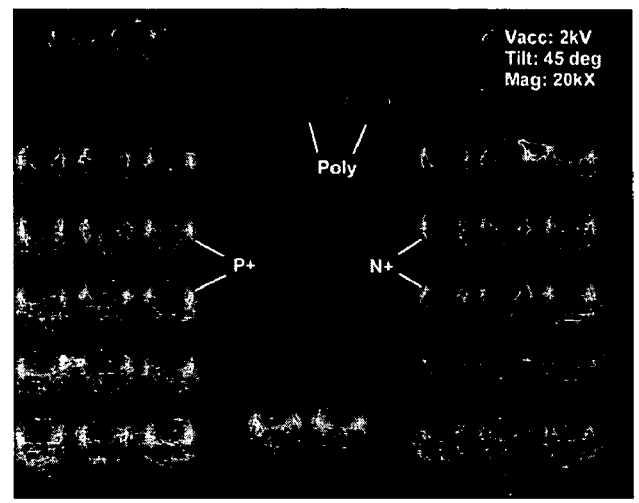
FIGS. 4(A) and 4(B) are two images of electrical contacts when the incident angle of the primary electron beam is approximately 45°.
Figure 4:
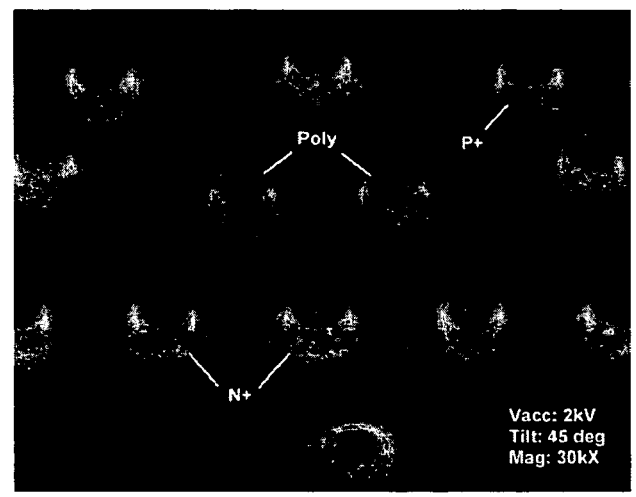

FIG. 4(A) is a SEM image of a die that comprises a variety of substantially circular electrical contacts on its surface, such as P+, N+ and polysilicon contacts. In this experiment, the accelerating energy level of the primary electron beam used herein is 2 KeV, the incident angle of the primary electron beam is about 45° and the magnification factor of the image is 20 KX. Note that the three types of electrical contacts have very similar brightness from which it is difficult to differentiate one type of contact from another one. FIG. 4(B) is another SEM image of the same die. The relevant imaging parameters used herein are almost the same as those used in FIG. 4(A) except that the magnification factor increases to 30 KX. Therefore, the image resolution in FIG. 4(B) is higher than that in FIG. 4(A). The brightness difference between the three types of contacts in this image is slightly more cognizable than the previous image. In particular, the contrast of the N+ and P+ contacts is higher than that of the polysilicon contacts. However, the overall quality of the image is not satisfactory for the purpose of accurately identifying electrical contacts made of different types of materials.

Figure 5:
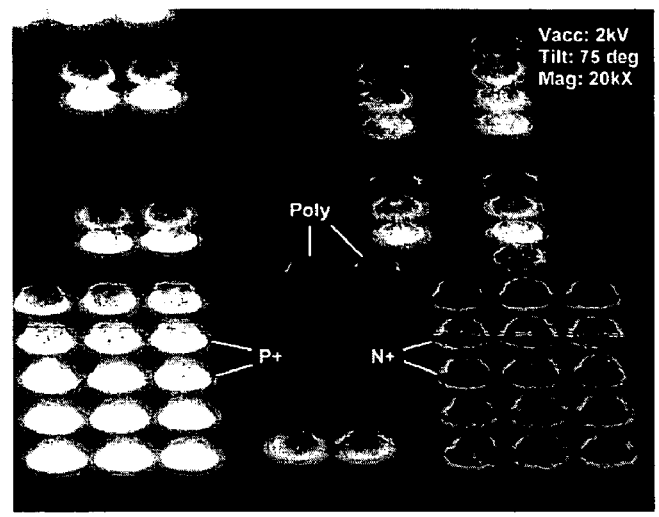
FIGS. 5(A) and 5(B) are two images of the electrical contacts when the incident angle of the primary electron beam increases to about 75°.
Figure 5:
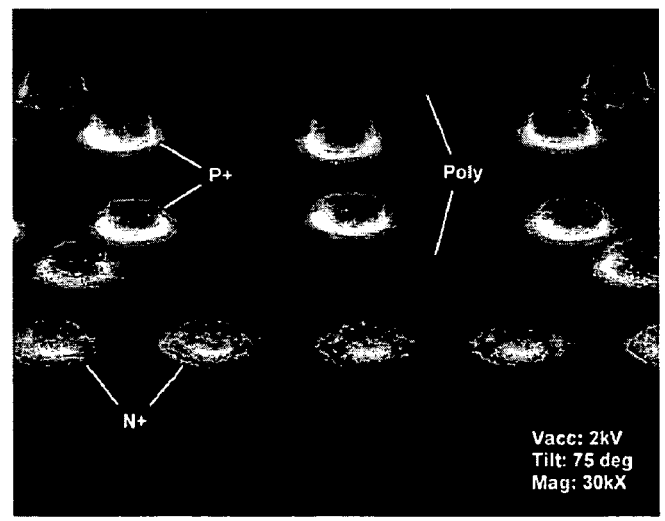

FIG. 5(A) is a SEM image of the same die when the incident angle of the primary electron beam increases to 75° while the other imaging parameters remain the same. Compared with FIG. 4(A), it is very easy to discern the three types of electrical contacts based on their brightness. Specifically, P+ contacts are the brightest among the three types, N+ contacts are in the middle and the polysilicon contacts are the darkest. Such difference becomes more obvious in FIG. 5(B) when the magnification factor increases from 20 KX to 30 KX.

The reason that a polysilicon contact is darkest is because the polysilicon contact is floating or electrically isolated from the substrate which is grounded. When the primary electron beam scans the die surface, the polysilicon contact begins accumulating beam electrons on its surface. After a certain time, the polysilicon contact is saturated with the primary beam electrons and the negative electrical field surrounding the polysilicon contact makes it very difficult for the beam electrons to reach the contact and generate secondary electrons. As a result, the secondary electron current near the polysilicon contact and therefore the corresponding image brightness is the weakest.

In contrast, both P+ and N+ contacts are electrically connected to the ground and any electron buildup on these contacts is quickly dissipated. As a result, the secondary electron currents near these contacts are stronger than that close to the polysilicon contact and they appear brighter in the image than the polysilicon contact. Further, there is a certain amount of negative charges associated with the N+ contact material. These charges have a negative impact on the secondary electron current near the N+ contact. This is why the N+ contact is slightly darker than the P+ contact in the image.

When comparing the shapes of an electrical contact in FIGS. 4(A) and 4(B) with FIGS. 5(A) and 5(B), it is quite obvious that the shapes in FIGS. 4(A) and 4(B) are more circular than those in FIGS. 5(A) and 5(B). This is clear evidence that the primary electron beam in FIGS. 5(A) and 5(B) has a higher incident angle. Clearly, increasing the incident angle has a positive effect on the image in that it is easier to identify the different types of electrical contacts having different passive voltages. The downside is that the electron beam focal area on a contact reduces with the increase of the incident angle, which tends to reduce the secondary electron current. Therefore, the optimal incident angle at which the passive voltage contrast is maximized has to be determined experimentally. Different surface structures and compositions may have different optimal incident angles. Our experiments suggest that such angle should be 75° or above.

Figure 6:
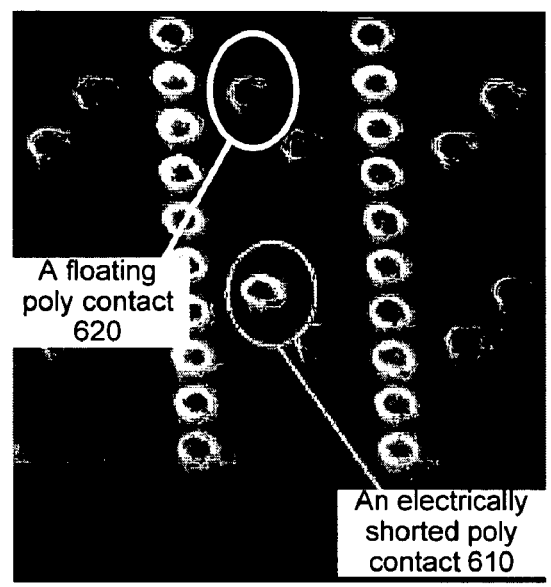
FIGS. 6(A) and 6(B) are two images that include defective electrical contacts which have a significantly different brightness from neighboring normal contacts of the same type.
Figure 6:
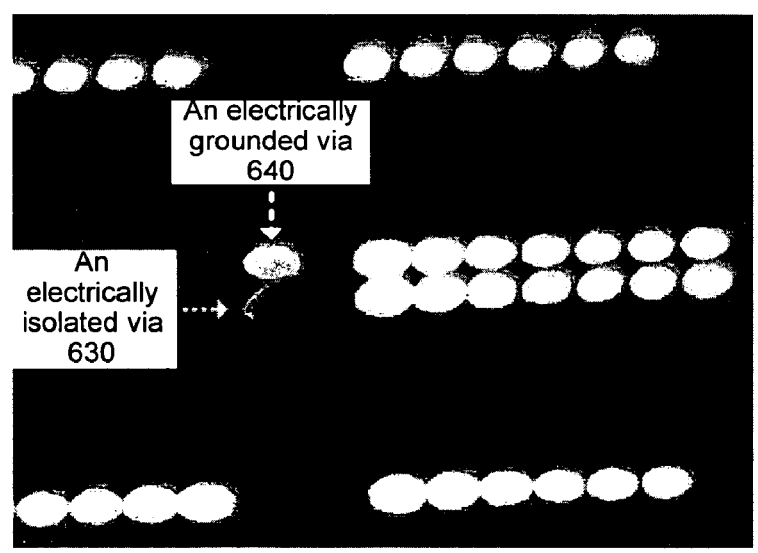

Finally, FIGS. 6(A) and 6(B) present two examples of the application of the invention to detection of electrical failures according to the present invention. FIG. 6(A) shows an electrically shorted polysilicon contact 610. As discussed above, a polysilicon contact normally should be floating or electrically disconnected from the substrate. As a result, the image of a normal polysilicon contact 620 should be quite dark. In contrast, the shorted polysilicon contact 610 can not accumulate negative charges and therefore its image is brighter. FIG. 6(B) depicts an electrically open via 630. The open via 630 is electrically isolated from other components on the substrate and a buildup of negative charges appears on its surface which reduces the secondary electron currents near the open via 630. Next to the open via 630 is a normal via 640 that is electrically connected to the ground. Therefore, via 640 has a much higher brightness than the open via 630.

The foregoing description, for purpose of explanation, has been made with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated.

What is claimed is:

1. A method for measuring passive voltage contrast on a die, comprising:
    providing a sample holder, the sample holder having a base and a supporting surface;
    attaching a die to the supporting surface of the sample holder, the die having a first surface hosting a circuit and a second surface that is in contact with the supporting surface of the sample holder;

scanning the first surface of the die using a primary electron beam incident on the first surface at an incident angle, thereby generating a passive voltage contrast on the first surface;

adjusting the supporting surface of the sample holder to increase the incident angle; and repeating the steps of scanning the first surface of the die and adjusting the supporting surface of the sample holder to increase the incident angle at least until an incident angle is reached at which the passive voltage contrast is maximized.

2. The method of claim 1, further comprising generating an image of the circuit when the passive voltage contrast is maximized, different portions of the image having different brightness corresponding to different passive voltages on the first surface of the die.

3. The method of claim 2, further comprising examining the portions of the image having an abnormal brightness to identify electrical failures in the die.

4. The method of claim 2, wherein the die is electrically connected to the ground through the sample holder.

5. The method of claim 4, wherein the circuit comprises at least a plurality of electrical components of a same type and one component whose brightness in the image is significantly different from that of others may be a defective component.

6. The method of claim 5, wherein there is an electrical shorting failure at the defective component if its brightness is higher than that of others in the image.

7. The method of claim 6, wherein there is an electrical open failure at the defective component if its brightness is lower than that of others in the image.

8. The method of claim 1, wherein the incident angle at which the passive voltage contrast is maximized is a function of the surface texture and surface composition of the die.

9. The method of claim 1, wherein the incident angle at which the passive voltage contrast is maximized is above 75°.

10. The method of claim 1, wherein the primary electron beam has an accelerating energy level of 1–5 KeV.

11. The method of claim 10, wherein the primary electron beam has an accelerating energy level of 2 KeV.

12. The method of claim 1, wherein the primary electron beam is generated by a scanning electron microscope.

13. An apparatus for measuring passive voltage contrast on a die, comprising:
a container having a primary electron beam generator and a secondary electron collector; and
a sample holder having an adjustable base and a stand on the base, the stand having an oblique surface for holding a die that faces the primary electron beam generator and the secondary electron collector, the primary electron beam being incident on a surface of the die at an incident angle, the base being adjustable such that the die surface can be moved through an incident angle that ranges from 45° to more than 75°.

14. The apparatus of claim 13, wherein the secondary electron collector is arranged to measure a secondary electron current at the location bombarded by the primary electron beam and the magnitude of the secondary electron current is a function of a local electrical field near the location.

15. A method for measuring passive voltage contrast on a die, comprising:
attaching a die to a supporting surface of a sample holder, the die having a first surface hosting a circuit and a second surface that is in contact with the supporting surface of the sample holder;
scanning the first surface of the die using a primary electron beam incident on the first surface at an incident angle, thereby generating a passive voltage contrast on the first surface;
changing the incident angle; and
repeating the steps of scanning the first surface of the die and changing the incident angle until an incident angle is reached at which the passive voltage contrast is maximized.

16. The method of claim 15, further comprising generating an image of the circuit when the passive voltage contrast is maximized, different portions of the image having different brightness corresponding to different passive voltages on the first surface of the die.

17. The method of claim 15, wherein the incident angle at which the passive voltage contrast is maximized is above 75°.

18. The method of claim 15, wherein the primary electron beam is generated by a scanning electron microscope.

* * * * *